(12) United States Patent
Guenin et al.

(10) Patent No.: US 7,425,760 B1
(45) Date of Patent: Sep. 16, 2008

(54) MULTI-CHIP MODULE STRUCTURE WITH POWER DELIVERY USING FLEXIBLE CABLES

(75) Inventors: Bruce M. Guenin, San Diego, CA (US); Nyles I. Nettleton, Campbell, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 437 days.

(21) Appl. No.: 11/250,100

(22) Filed: Oct. 12, 2005

Related U.S. Application Data (60) Provisional application No. 60/618,644, filed on Oct. 13, 2004.

(51) Int. Cl.
H01L 23/04 (2006.01)
H01L 23/34 (2006.01)

(52) U.S. Cl. ............... 257/698; 257/724; 257/E23.003; 257/E23.078; 257/E23.079; 438/110

(58) Field of Classification Search ................. 257/698, 257/724, E23.003, E23.078, E23.079; 438/110
See application file for complete search history.

(56) References Cited

U.S. PATENT DOCUMENTS

| | | | |
|---|---|---|---|
| 3,584,287 A | 6/1971 | Binoche | |
| 3,613,033 A | 10/1971 | Denes | |
| 3,794,759 A | 2/1974 | Nick | |
| 3,983,546 A | 9/1976 | Zappe | |
| 4,339,668 A | 7/1982 | Mueller et al. | |
| 4,349,862 A | 9/1982 | Bajorek et al. | |
| 4,376,921 A | 3/1983 | Dickens et al. | |
| 4,605,915 A | 8/1986 | Marshall et al. | |
| 4,633,035 A | 12/1986 | McMonagle | |
| 4,640,866 A | 2/1987 | Suzuki | |
| 4,642,569 A | 2/1987 | Hayes et al. | |
| 4,654,581 A | 3/1987 | Neukermans et al. | |
| 4,675,717 A | 6/1987 | Herrero et al. | |
| 4,775,573 A | 10/1988 | Turek | |

(Continued)

FOREIGN PATENT DOCUMENTS

DE 2902002 A1 7/1980

(Continued)

OTHER PUBLICATIONS

Balde, John W. Crisis in Technology: The Questionable U.S. Ability to Manufacture Thin-Film Multichip Modules, Proceeding of the IEEE, vol. 80, No. 12, pp. 1995-2002, Dec. 1992.

(Continued)

*Primary Examiner*—Ngan Ngo
(74) *Attorney, Agent, or Firm*—Park, Vaughan & Fleming LLP (57) ABSTRACT

One embodiment of the present invention provides an integrated circuit module. This module includes a semiconductor die with an active face, upon which active circuitry and signal pads reside, and a back face opposite the active face. The module uses a flexible cable to deliver electrical power to the active face of the semiconductor die from a power distribution board located above the active face of the semiconductor die. This flexible cable provides electrical power to the semiconductor die without interfering with the alignment and heat removal functions of the module.

20 Claims, 6 Drawing Sheets

U.S. PATENT DOCUMENTS

| | | | |
|---|---|---|---|
| 4,812,885 | A | 3/1989 | Riemenschneider |
| 4,876,535 | A | 10/1989 | Ballmer et al. |
| 4,931,991 | A | 6/1990 | Cvijanovich |
| 4,982,311 | A | 1/1991 | Dehaine et al. |
| 4,999,593 | A | 3/1991 | Anderson |
| 5,012,321 | A | 4/1991 | Magarshack |
| 5,027,253 | A | 6/1991 | Lauffer et al. |
| 5,073,761 | A | 12/1991 | Waterman et al. |
| 5,099,393 | A * | 3/1992 | Bentlage et al. ............. 361/785 |
| 5,103,283 | A | 4/1992 | Hite |
| 5,119,172 | A | 6/1992 | Cho et al. |
| 5,138,436 | A | 8/1992 | Koepf |
| 5,155,655 | A | 10/1992 | Howard et al. |
| 5,155,656 | A | 10/1992 | Narashimhan et al. |
| 5,269,882 | A | 12/1993 | Jacobsen |
| 5,270,485 | A | 12/1993 | Jacobsen |
| 5,272,600 | A | 12/1993 | Carey |
| 5,309,122 | A | 5/1994 | Cox et al. |
| 5,356,484 | A | 10/1994 | Yater et al. |
| 5,365,205 | A | 11/1994 | Wong |
| 5,376,904 | A | 12/1994 | Wong |
| 5,404,265 | A | 4/1995 | Moresco et al. |
| 5,432,486 | A | 7/1995 | Wong |
| 5,507,668 | A * | 4/1996 | Lambrinos et al. .......... 439/502 |
| 5,629,838 | A | 5/1997 | Knight et al. |
| 5,638,402 | A | 6/1997 | Osaka et al. |
| 5,673,131 | A | 9/1997 | Jacobsen |
| 5,696,027 | A * | 12/1997 | Crane et al. ................. 438/612 |
| 5,786,979 | A | 7/1998 | Douglass |
| 5,822,551 | A * | 10/1998 | Crane et al. ................. 710/307 |
| 5,854,480 | A | 12/1998 | Noto |
| 5,863,832 | A | 1/1999 | Doyle et al. |
| 6,018,465 | A * | 1/2000 | Borkar et al. ............... 361/825 |
| 6,081,030 | A | 6/2000 | Jaouen et al. |
| 6,139,337 | A * | 10/2000 | Englert et al. ................. 439/91 |
| 6,310,400 | B1 | 10/2001 | Doyle et al. |
| 6,347,039 | B1 * | 2/2002 | Lee ........................... 361/760 |
| 6,496,359 | B2 | 12/2002 | Clark et al. |
| 6,500,696 | B2 | 12/2002 | Sutherland |
| 6,559,531 | B1 | 5/2003 | Sutherland |
| 6,583,902 | B1 * | 6/2003 | Yuen .......................... 398/135 |
| 6,600,325 | B2 | 7/2003 | Coates et al. |
| 6,717,275 | B2 * | 4/2004 | Matsuura et al. ............ 257/778 |
| 6,728,113 | B1 | 4/2004 | Knight et al. |
| 6,847,529 | B2 * | 1/2005 | Dibene et al. ............... 361/803 |
| 6,898,076 | B2 * | 5/2005 | Pappalardo et al. ......... 361/683 |
| 7,126,829 | B1 * | 10/2006 | Yen ............................ 361/803 |
| 7,130,191 | B2 * | 10/2006 | Lin et al. .................... 361/695 |
| 7,290,323 | B2 * | 11/2007 | Deconde et al. ............... 29/595 |
| 2002/0018339 | A1 * | 2/2002 | Uzuka et al. ................ 361/796 |
| 2003/0015646 | A1 * | 1/2003 | Deconde et al. .......... 250/208.1 |
| 2003/0067744 | A1 * | 4/2003 | Pappalardo et al. ......... 361/686 |
| 2003/0080438 | A1 * | 5/2003 | Matsuura et al. ............ 257/778 |
| 2003/0176787 | A1 * | 9/2003 | Gilbert et al. ............... 600/437 |
| 2003/0202330 | A1 * | 10/2003 | Lopata et al. ............... 361/760 |
| 2004/0105240 | A1 * | 6/2004 | Haba et al. ................. 361/752 |
| 2005/0142950 | A1 * | 6/2005 | Haba et al. ................. 439/631 |
| 2005/0184376 | A1 * | 8/2005 | Salmon ...................... 257/686 |
| 2005/0194669 | A1 * | 9/2005 | Kim et al. ................... 257/678 |
| 2005/0195255 | A1 * | 9/2005 | Shinada et al. ................ 347/86 |
| 2006/0017150 | A1 * | 1/2006 | Zingher et al. ............. 257/688 |
| 2006/0033790 | A1 * | 2/2006 | Shinada et al. ................ 347/86 |
| 2006/0091507 | A1 * | 5/2006 | Fjelstad et al. ............. 257/676 |
| 2007/0108886 | A1 * | 5/2007 | Miyazaki et al. ............ 313/495 |
| 2007/0120575 | A1 * | 5/2007 | Haba et al. .................... 326/30 |
| 2007/0210446 | A1 * | 9/2007 | Andry et al. ................ 257/714 |

FOREIGN PATENT DOCUMENTS

| | | |
|---|---|---|
| EP | 048298 A1 | 11/1992 |
| JP | 05083011 A | 4/1993 |
| JP | 06260813 A | 9/1994 |
| JP | 06315435 A | 11/1994 |

OTHER PUBLICATIONS

Garrou, Philip, Polymer Dielectrics for Multichip Module Packaging, Proceedings of the IEEE, vol. 80, No. 12, pp. 1942-1954, Dec. 1992.

Hagge et al., High-Yield Assembly of Multichip Modules Through Known-Good IC's and Effective Test Strategies, Proceedings of the IEEE, vol. 80, No. 12, pp. 1965-1994, Dec. 1992.

Knight et al., Manufacturability of Capacitively Coupled Multichip Modules, 1994 Proceedings 44th Electronic Components and Technology Conference, May 1994.

Schaper, Leonard, Design of Multichip Modules, Proceedings of the IEEE, vol. 80, No. 12, pp. 1955-1964, Dec. 1992.

Tummala, Rao R., Fundamentals of Microsystems Packaging (McGrall Hill 2001), pp. 16-18 and 298-303.

Tummala, Rao R., Multichip Packaging—a Tutorial, Proceedings of the IEEE, vol. 80, No. 12, pp. 1925-1941, Dec. 1992.

Balde et al., Multiplechip Packaging and the Need for New Materials, Journal of Electronic Materials, Feb. 1989, reprinted in Multichip Modules: Systems Advantages, Major Constructions, and Materials Technologies, Johnson et al. (eds.) (1991).

Begay et al., Getting to Know Your MCM Die, ICEMM Proc. 1993 International Conference and Exhibition on Multichip Modules, pp. 160-165 (Apr. 1993).

Chappell et al., Fast CMOS ECL Receivers with 100 mV Worst-Case Sensitivity, IEEE Journal of Solid-State Circuits, vol. 23, No. 1 (Feb. 1988).

Doane and Franzon, MCM Technologies and Alternatives, The Basics, pp. 1-35, 37-131, 817-843 (1992).

Martin et al., A Practical Approach to Producing Known-Good Die, ICEMM Proc. 1993 International Conference and Exhibition on Multichip Modules, pp. 139-151 (Apr. 1993).

Morris, Electronics Packaging Forum, vol. 1, State Univ. of NY, Binghampton, Van Nostrand Reinhold, NY pp. 1-116 (1990).

Neugebauer et al., Multichip Module Designs for High Performance Applications, Proceedings of NEPCON West (1989) reprinted in Multichip Module.

Turlik, Prolog to the Special Section on Multichip Module Technology, Proc. IEEE, vol. 80, No. 12 (Dec. 1992).

IBM Technical Disclosure Bulletin, Modular Read Only Store, vol. 6, No. 11, Apr. 1964, New York, pp. 43.

* cited by examiner

MULTI-CHIP MODULE STRUCTURE WITH POWER DELIVERY USING FLEXIBLE CABLES

RELATED APPLICATION

This application claims priority under 35 U.S.C. 119(e) to U.S. Provisional Application Ser. No. 60/618,644, filed on Oct. 13, 2004, the contents of which are herein incorporated by reference.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention generally relates to semiconductor integrated circuits. More specifically, the present invention relates to an integrated circuit module in which a flexible cable delivers electrical power to the semiconductor die without interfering with the alignment and heat removal functions.

2. Related Art

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit data signals directly from the first chip to the second chip without having to route the data signals through intervening signal lines within a printed circuit board.

The effectiveness of capacitive coupling depends on the relative position of the transmitter pads and the receiver pads, both in a plane defined by the pads and in a direction perpendicular to the plane. For example, misalignment in the plane may cause each receiving pad to span two transmitting pads, thereby destroying a received signal. In theory, satisfactory communication requires that any misalignment is less than half of a pitch between the pads. However, in practice, the alignment requirements may be more stringent. In addition, limiting overall misalignment may improve communication performance between the chips and reduce power consumption.

Unfortunately, it is not a simple matter to align the chips properly using existing mounting structures, such as conventional single-chip modules or conventional multi-chip modules. The chips in these structures are subject to thermal expansion and mechanical vibrations, as well as manufacturing and assembly perturbations that cause alignment problems. Furthermore, a need to deliver power and cooling to chips that communicate through proximity communication further complicates chip alignment.

Hence, what is needed is a method and an apparatus for delivering power to chips without interfering with alignment and heat-removal functions.

SUMMARY

One embodiment of the present invention provides an integrated circuit module. This module includes a semiconductor die with an active face, upon which active circuitry and signal pads reside, and a back face opposite the active face. The module uses a flexible cable to deliver electrical power to the active face of the semiconductor die from a power distribution board located above the active face of the semiconductor die. This flexible cable provides electrical power to the semiconductor die without interfering with the alignment and heat removal functions of the module.

In a variation on this embodiment, the use of the flexible cable for power delivery facilitates the layout of arrays of multiple semiconductor dies in a single layer.

In a variation on this embodiment, the integrated circuit module also includes a carrier chip. The back face of the semiconductor die is attached to the carrier chip, and the two are electrically interconnected.

In a further variation, the module also includes a bridge chip mounted to a semiconductor chip using a mounting, interconnect, and communication structure. When this bridge chip is positioned so that a free end is in proximity with a neighboring semiconductor chip, the bridge chip supports proximity communication between the semiconductor chip in the integrated circuit module and the neighboring semiconductor chip.

In a further variation, the carrier chip is mounted on top of a cooling plate. A thermal interface material located between the carrier chip and cooling plate ensures a thermal connection between the carrier chip or semiconductor die and the cooling plate, which facilitates the transfer of heat from the semiconductor die and/or the carrier chip to the cooling plate.

In a further variation, the module also includes a spring assembly that applies force to the semiconductor die and/or the carrier chip to ensure intimate contact and thermal conductivity between the carrier chip and the cooling plate. Lateral forces are also applied to the semiconductor die and/or the carrier chip to ensure contact with a set of alignment structures.

In a variation on this embodiment, the flexible cable includes both a flexible portion and a rigid portion. The flexible portion of the flexible cable has sufficient flexibility that it will not impede alignment of the semiconductor die, and also includes sufficient metal to reduce electrical impedance and thereby reduces voltage drop across the length of the cable.

In a further variation, an additional integrated circuit is integrated into the rigid portion of the flexible cable. This additional integrated circuit enhances the functionality and performance of the semiconductor die. In this variation, another rigid portion of the flexible cable is mounted to the semiconductor die.

In a further variation, the additional integrated circuit provides voltage conversion functionality for the semiconductor die.

In a further variation, the flexible cable connects to the power distribution board using a connector. This connector allows the integrated circuit module to be inserted into or removed from an array of multiple modules, thus eliminating the need to connect the two using soldering operations.

In a variation on this embodiment, the power distribution board includes openings for optical fibers or electrical wires that facilitate communication between the semiconductor die and devices located above the power distribution board.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Challenges of Proximity Communication

"Proximity communication" makes possible direct chip-to-chip communication and hence enables large arrays of densely-packed integrated circuit (IC) chips. Such a dense packing enables low-latency communication between chips, but also requires packaging structures that can support the injection of many amps per unit area and extraction of many watts of heat per unit area. Furthermore, proximity communication requires high precision in the alignment of chips.

Existing systems that use proximity communication between a number of IC chips are configured with two layers of carrier chips, with the corners of each chip in one layer either in contact with or proximity to the corners of chips in the opposite layer. In this configuration, electrical power and cooling are supplied separately to the exterior surface of each chip layer. As a result, the power distribution and cooling components serving a given chip layer share the same volume immediately beyond the chip layer, making it more difficult to optimize these separate functions.

Existing module designs often include a precision alignment structure. However, when an alignment structure such as a jig plate is co-located with the two chip layers, and as a result does not contact a cooling plate, the temperature of the alignment structure varies according to the power dissipated by the chips in the module. Consequently, to prevent thermal expansion problems, the alignment structure should ideally be composed of low-thermal-expansion materials such as silicon. Furthermore, while the alignment structure provides chip alignment in the x-y plane and in the z dimension, it is limited in thickness to a value not much more than the total thickness of the two chip layers. This limits the rigidity of the alignment structure in response to deformations along the z-axis.

Yet another set of challenges arise from integrating the chip-array voltage-regulator-module (VRM) components (which supply current at the voltage required by the chip array) with the optical or electrical signal cables used by external communication components. Because of the dense packing of chips and the requirement that they be sandwiched between their respective power distribution and cooling components, the only practical location for positioning the VRM components is at the perimeter of the array. Finding the space to integrate both enough VRM components to satisfy the power distribution requirements as well as enough external communication components to satisfy the requirements for high-bandwidth signaling can become a significant challenge. Since the border area of a chip array grows linearly while the area and functionality grow quadratically, existing techniques for communicating between chips and the outside world will not scale as chip and chip array sizes increase.

All of the aforementioned challenges become more difficult as the size of the chip array increases.

The Few-Chip Module

The present disclosure describes the design of an integrated module that achieves alignment, power distribution, and thermal management functions in a readily manufacturable, reworkable assembly. This "few-chip module" (FCM) integrates a set of computation and communication chips.

Figure 1A:
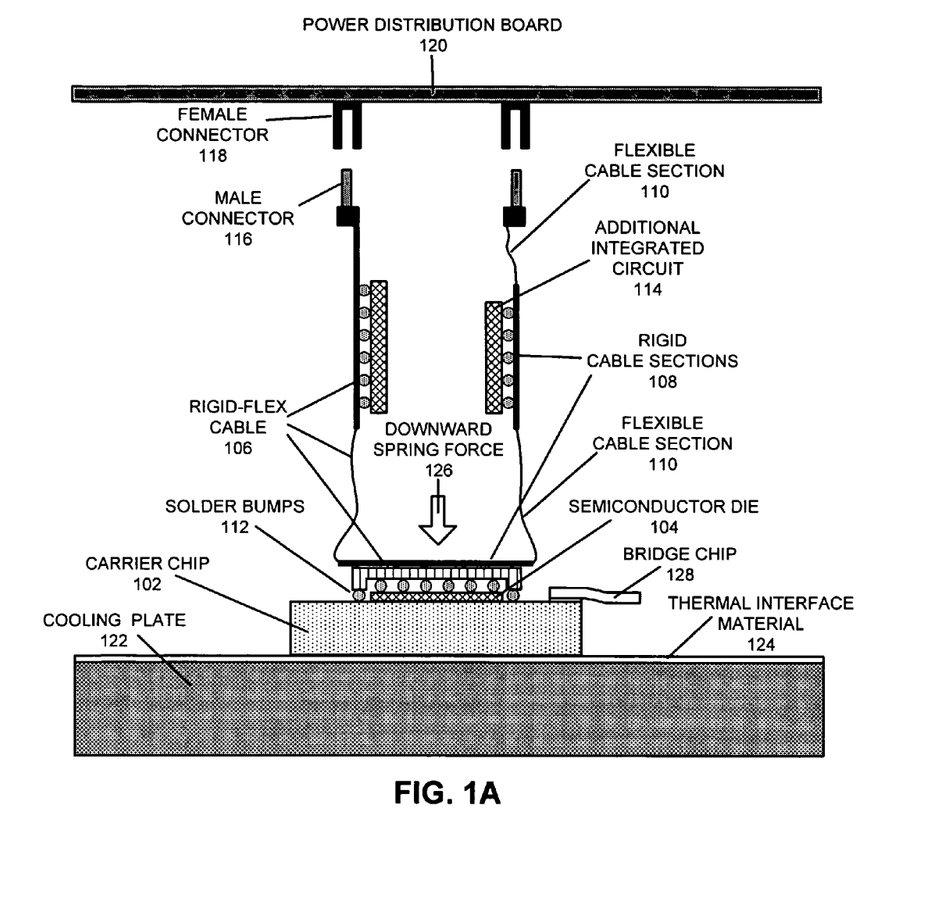
FIG. 1A illustrates a few-chip module in accordance with an embodiment of the present invention.

FIG. 1A illustrates an FCM, which contains an integrated circuit chip (or chip stack) that can be used for computation, memory, I/O, optical communication, or other logic or communication functions. In the chip stack shown in FIG. 1A, a carrier chip 102 acts as a host for a semiconductor die 104 (hereafter referred to as the "payload chip"). The active face of the payload chip faces upwards and it attaches to a rigid-flex cable 106. Note that although the back side of the payload chip faces the carrier chip, the payload chip is mechanically attached and electrically interconnected to the carrier chip, e.g. using vias or traces over the top and side of the payload chip. Also, note that while in this example the payload and carrier chips are separate, they can also be combined into one monolithic chip. The primary purpose of the carrier chip in this example is communication.

The primary function of the rigid-flex cable is to provide an electrical interconnection between the payload chip and a power distribution board (PDB) 120 located above the FCM. The rigid-flex cable is composed of layers of metal and dielectric, with stiffening layers added in the regions requiring rigidity. Specifically, this flat cable is rigid 108 in the regions of solder bump and/or solder ball attachments, but is flexible 110 in the intervening regions. A lower rigid region is connected to the payload chip using a solder bump attach 112. Since it is difficult to internally distribute power across chips, one benefit of the rigid-flex cable is that it can inject power as needed into every area of the chip. Note that FIG. 1A is not to scale and presents a cross-sectional view; the rigid-flex cable has four separate wings that form a "box." A support tube structure can be used to guide and support the set of rigid-flex cables. This support tube also serves to cool the devices attached to the rigid-flex cable by conducting their heat to the cooling plate 122.

The upper rigid region of the rigid-flex cable supports the integration of additional integrated circuits 114 and other electrical components that enhance the performance of the chip stack. The rigid region provides a planar mounting surface for chips, and thereby facilitates a more reliable connection than a flexible cable. Possible functions for these additional chips can include voltage conversion and memory. A soldering process creates the electrical connections between the various chips and the rigid-flex cable. Several solders with a hierarchy of melting points may be necessary to sequentially surface-mount a set of such chips.

The flexible portion 110 of the rigid-flex cable provides the FCM with sufficient compliance to not impede the chip-stack-alignment process. Although flexible, the cable still contains sufficient metal to ensure low electrical impedance and, as a result, a manageable voltage drop across the cable length. The flexible portion of the cable can be formed into a shape that enhances its compliance in the x, y, and z-axis directions.

One of the key goals of the FCM is a package that can easily be incorporated into multi-chip modules (MCM). To this end, the ends of the rigid-flex cable include a male connector 116 that plugs into a female connector 118 on the PDB 120.

A cooling plate 122 removes heat from the FCM. Depending upon the amount of heat that must be removed, the planar surface of the cooling plate 122 can continue into a structure that could include an air-cooled heat sink, a water-cooled cold plate, and/or other cooling mechanisms. A spring assembly imparts a downward force on the top surface of the rigid portion of the cable mounted to the chip stack to push the carrier chip into intimate contact with a thermal interface material (TIM) 124 and the cooling plate 122. This intimate contact ensures a low thermal resistance for heat transfer from the chip stack to the cooling plate below. The spring assembly is not shown, but the spring force 126 applied is illustrated by an arrow in FIG. 1A.

Figure 1B:
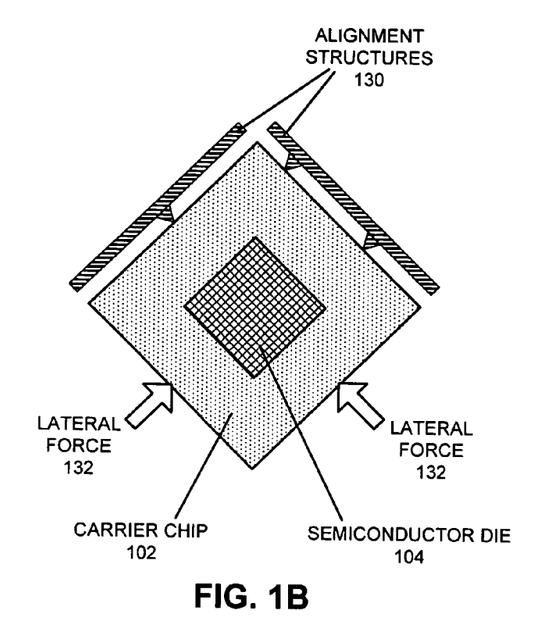
FIG. 1B illustrates lateral alignment of a few-chip module in accordance with an embodiment of the present invention.

FIG. 1B illustrates a second set of lateral forces 132 that may be applied to align the chips with a set of alignment structures 130. Such lateral forces are unusual for bonded-chip modules, since lateral forces typically stress bond joints and solder points. The system should be designed such that the lateral forces, which can be applied either to the sides of the chips or through the portion of the rigid-flex cables attached to the chip, exceed any forces opposing alignment. Opposing forces can include the force exerted by the rigid-flex cables and friction between the carrier chip, the cooling plate, and/or the alignment structure. These lateral forces should not be of such a magnitude that they should excessively stress any bond joints or solder points.

Bridge Chips

Proximity communication between neighboring chips is accomplished using small, low-power bridge chips whose primary function is communication. These bridge chips may be composed of different materials depending on the design. For instance, a bridge chip requiring active circuitry could be made out of a semiconductor such as silicon, while a passive bridge chip not requiring amplification might be made out of other non-semiconductor materials.

Figure 2:
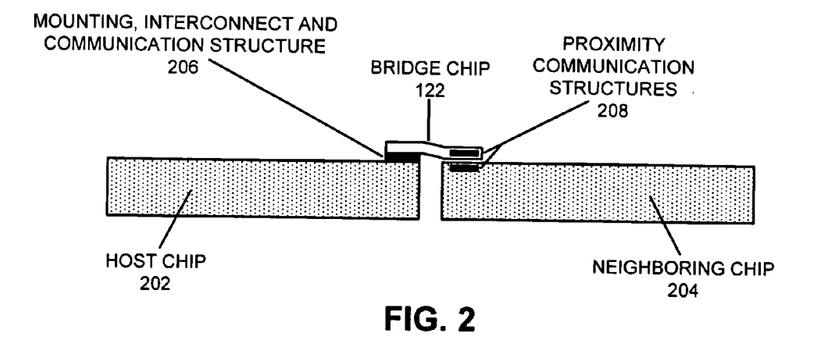
FIG. 2 illustrates the bridge chip concept in accordance with an embodiment of the present invention.

FIG. 2 illustrates a bridge chip 122 coupled to a host chip 202 via a mounting, interconnect, and communication structure 206. This coupling can be either non-conductive or conductive; each coupling approach has trade-offs, for instance in complexity of alignment or thermal stress/expansion.

The host chip both transmits digital signals into the bridge chip and receives signals from it. The free end of the bridge chip is positioned to overlap with a region of a neighboring chip 204 containing proximity communication structures 208. Since the proximity communication circuitry has exacting requirements, the host and neighbor chip are precisely aligned with respect to each other in the x-y plane. As shown in FIG. 2, the top surfaces of the host chip 202 and neighboring chip 204 are maintained at nearly the same height, within a tolerance that depends upon the compliance of the bridge chip and the design of the proximity communication circuitry.

A variety of techniques are used to facilitate the alignment of chips for proximity communication. Receive pads are often larger than transmit pads, to reduce the likelihood of transmission overlap. The pairing of receive and transmit pads can also be flexibly re-assigned depending on the x and y alignment of the chips. Capacitive sensing can be used as a yardstick to measure how chips have moved in relation to each other, after which the pads can be re-aligned by reassigning communication links based on pad proximity. Such electronic alignment techniques relax the mechanical alignment requirements.

Figure 3A:
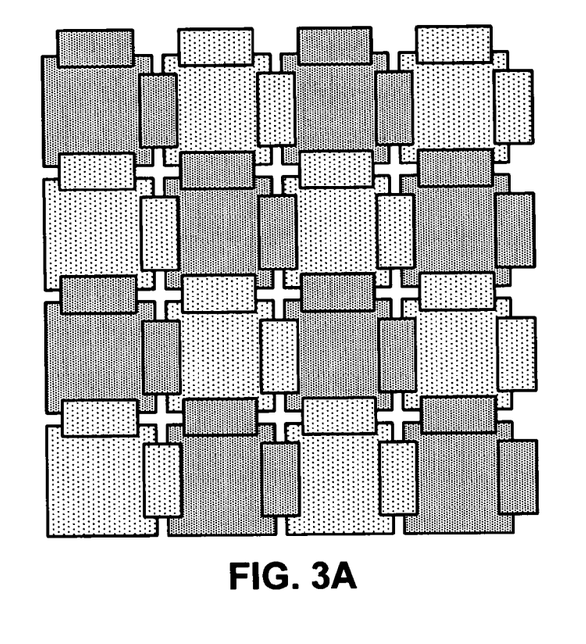
FIG. 3A illustrates a single-design host chip with bridge chips attached on two sides in accordance with an embodiment of the present invention.
Figure 3B:
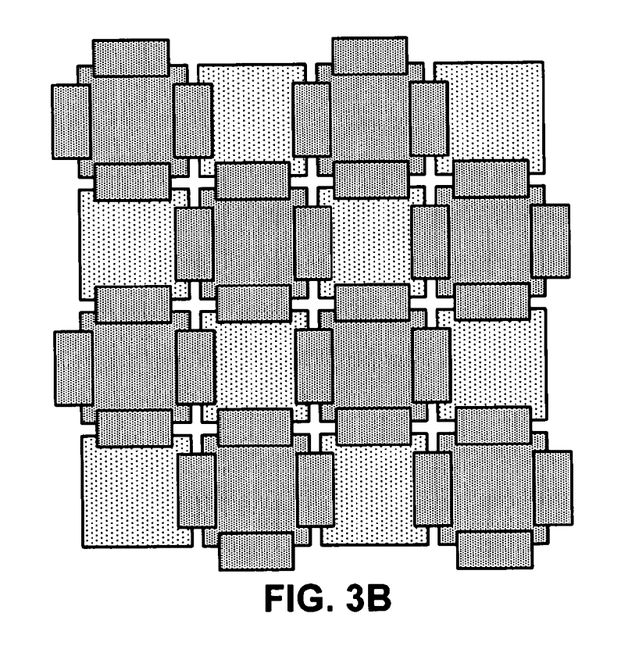
FIG. 3B illustrates a tiling concept with two different types of host chips in accordance with an embodiment of the present invention.

FIGS. 3A and 3B illustrate two different tiling patterns involving bridge chips. FIG. 3A illustrates a multi-chip module composed of single-design host chips that have bridge chips attached on two sides. The drawback of this approach is that in order to remove an arbitrary host chip from the array it may be necessary to remove a large number of chips.

FIG. 3B illustrates a different tiling concept in which there are two different types of host chips; one type acts as a host to four bridge chips, while the other type hosts no bridge chips. The advantage of this tiling pattern is that at most four chips have to be removed in order to remove an arbitrary chip from the array. Since the size of the host chip arrays may vary from several chips to as many as several hundred, this tiling pattern can result in a considerable improvement in the removal process.

Bridge chips may be attached to the sides of host chips, as shown, as well as to the corners.

Multi-Chip Modules of FCMs

Configuring chips in a single layer offers significant benefits for the module packaging objectives of chip alignment, thermal management, and power distribution. The rigid-flex cable and the bridge chips facilitate arranging the carrier chips of an array of FCMs into a single, co-planar layer, with the second layer of smaller, low-power bridge chips providing proximity communication functionality between neighboring carrier chips. This arrangement simplifies the design of the multi-chip module (MCM) considerably.

The FCM design also facilitates the insertion of pre-tested FCM modules in a MCM. The integrated MCM provides the components for aligning, injecting power into, and extracting heat from FCMs. Connectors allow FCMs to be inserted and removed from the MCM using a simple mechanical assembly process. The fact that FCMs can be pre-tested for electrical functionality before insertion is of great relevance to successfully using a given FCM in the MCM. When a large number of untested chips are used in an MCM, there is a significant probability that one or more of the FCMs will be defective. Thus, being able to test FCMs before assembly into the MCM greatly reduces the risk of having malfunctions at the MCM level.

Figure 4A:
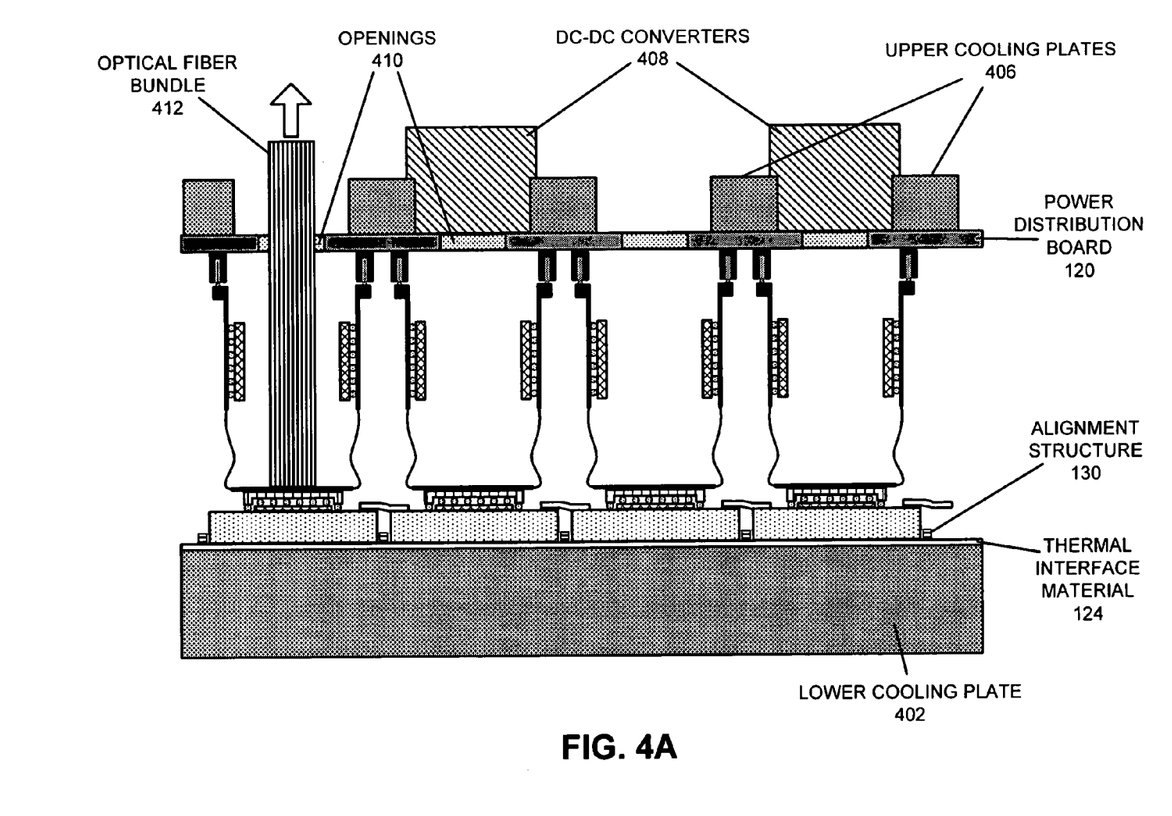
FIG. 4A illustrates a multi-chip module composed of few-chip modules in accordance with an embodiment of the present invention.

A MCM composed of FCMs is illustrated in FIG. 4A. Note that this is a cross-sectional view intended to represent an array of chips that are in a 2-D tiling pattern, such as those shown in FIGS. 3A and 3B.

The lower cooling plate 402 (also shown in FIG. 1A) removes the heat generated by all of the carrier, payload, and bridge chips in the MCM. For instance, an internal water-cooled design may extract several hundred $W/cm^2$ while maintaining a temperature difference between the incoming water and top surface of the plate of only several tens of degrees C. In addition, the cooling plate has a low value of surface roughness and maintains adequate flatness under the thermal and contact load of the carrier chips. These constraints relate to the need for both a low-resistance thermal joint between the chips and the cooling plate as well as for z-axis alignment of the top surfaces of the neighboring chips.

The TIM 124 is also designed to maintain a low thermal resistance joint between the bottom of the carrier chip and the top surface of the cooling plate. Acceptable TIMs provide a stable thermal joint across many temperature cycles, and can include pastes, greases, and oils. Preferred TIMs require only a small contact pressure to maintain low thermal resistance, in order to simplify the mechanical requirement of applying pressure to an array of as many as several hundred chips. Finally, TIM thickness is controlled to support the chip z-alignment requirements.

The precision-manufactured alignment structure 130 facilitates proximity communication by aligning the carrier chips in the x and y directions. An alignment structure can comprise both a separate grid-like structure and/or structures integrated into the cooling plate. The alignment structure is configured to be in good thermal contact with the cooling plate but only weak thermal contact with the carrier chips, so that the temperature of the alignment remains independent of the power dissipated in the chip stack. A benefit of temperature consistency is that the alignment structure does not expand or contract significantly during the temperature fluctuation of MCM operation. This stability eliminates the need to make the coefficient of thermal expansion a first priority when selecting the alignment structure material, and allows choice from a wider range of materials compatible with precision fabrication methods.

Since the alignment structure aligns the chip in the x and y directions, it is important that the spring structure and rigid-flex cable not impede the x-y motion of the chip stack. The surfaces of the carrier chips are processed, e.g. via polishing or etching, to create alignment surfaces that allow the chip to be precision-aligned with the alignment structure for proximity communication purposes. The spring structure pushes the carrier chip into contact with the cooling plate and supports the z-alignment requirements of the carrier chips while not interfering with x and y alignment. Meanwhile, the rigid-flex cable, by nature of its mechanical compliance, accommodates small motions of the carrier chip as it aligns with the alignment structure, while also decoupling the carrier chip from any motion of the PDB.

The Power Distribution Board

The rigid-flex cable facilitates the offset of the PDB from the cooling plate, so that, as a result, there is no competition for space between the heat removal and power distribution functions.

As mentioned previously, using a connector facilitates the electrical interconnection of the FCM and PDB without soldering operations, leading to an efficient rework process in case of FCM failure. For ease of assembly and disassembly of the module, a zero-insertion-force socket is preferred. The connector should be capable of reliably supporting the electrical currents required for the operation of all of the devices on the FCM.

The PDB itself provides a number of functions. In addition to transmitting electrical power between a set of DC-DC voltage converters 408 and the FCMs, the PDB also mechanically supports the connectors and upper portions of the FCMs. Openings 410 in the PDB also provide access for cables or fiber bundles linking the chip stack to the region above the PDB. These openings 410 allow arbitrary array chips to communicate with devices located above the PDB using either optical or electrical signals.

The PDB has sufficient metal layers and thickness to keep power transients and self-heating within acceptable levels. Furthermore, the mechanical rigidity of the PDB ensures a reasonably stationary position during MCM operation and thus prevents the carrier chip alignments from being perturbed. A set of upper cooling plates 406 remove the heat generated by the PDB, the DC-DC converters 408, and the devices integrated into the upper region of the rigid-flex cable. These upper cooling plates 406 include cable/fiber-routing openings in line with those in the PDB.

Figure 4B:
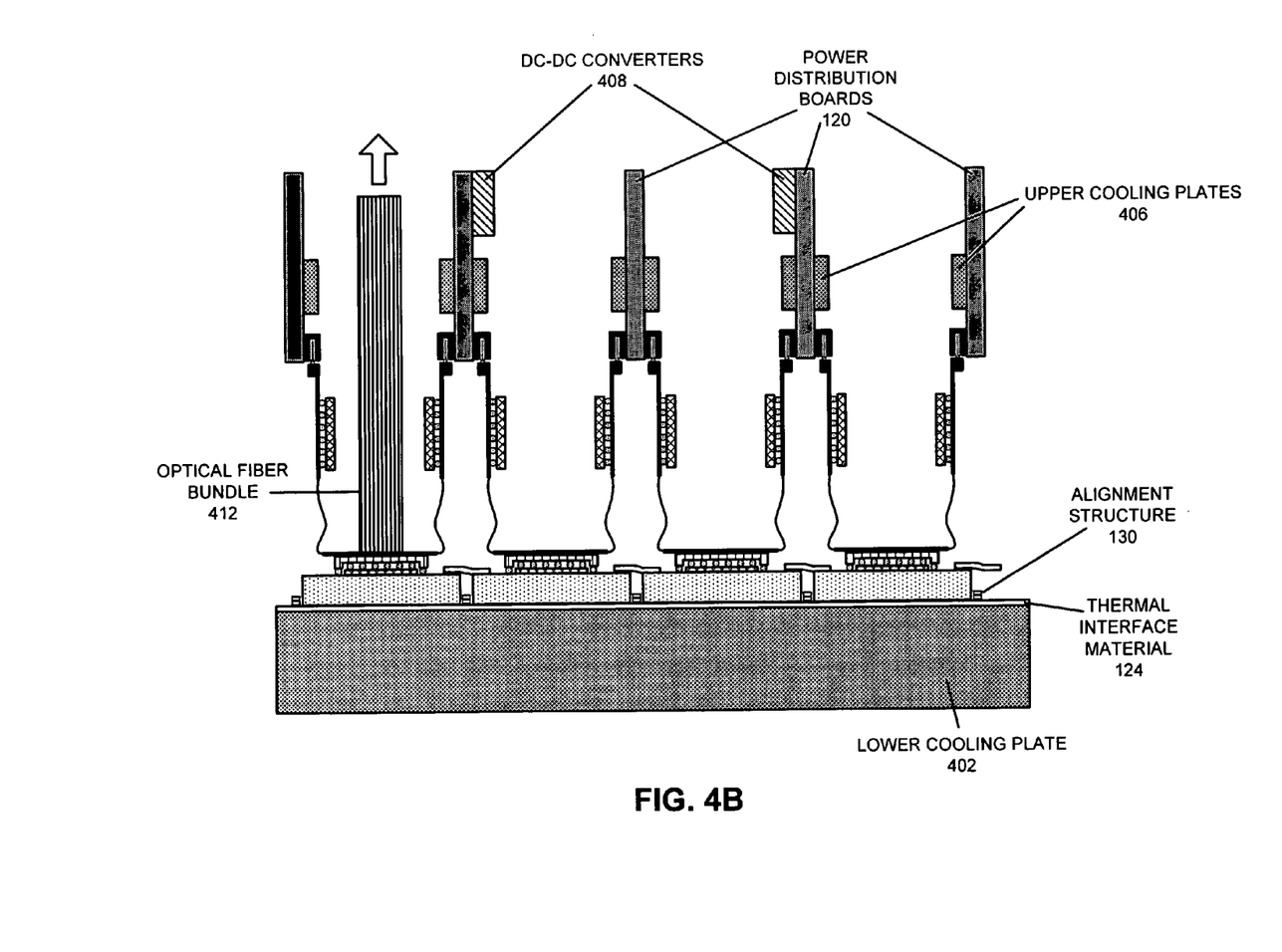
FIG. 4B illustrates an alternate power distribution board configuration for a multi-chip module composed of few-chip modules in accordance with an embodiment of the present invention.
Figure 4C:
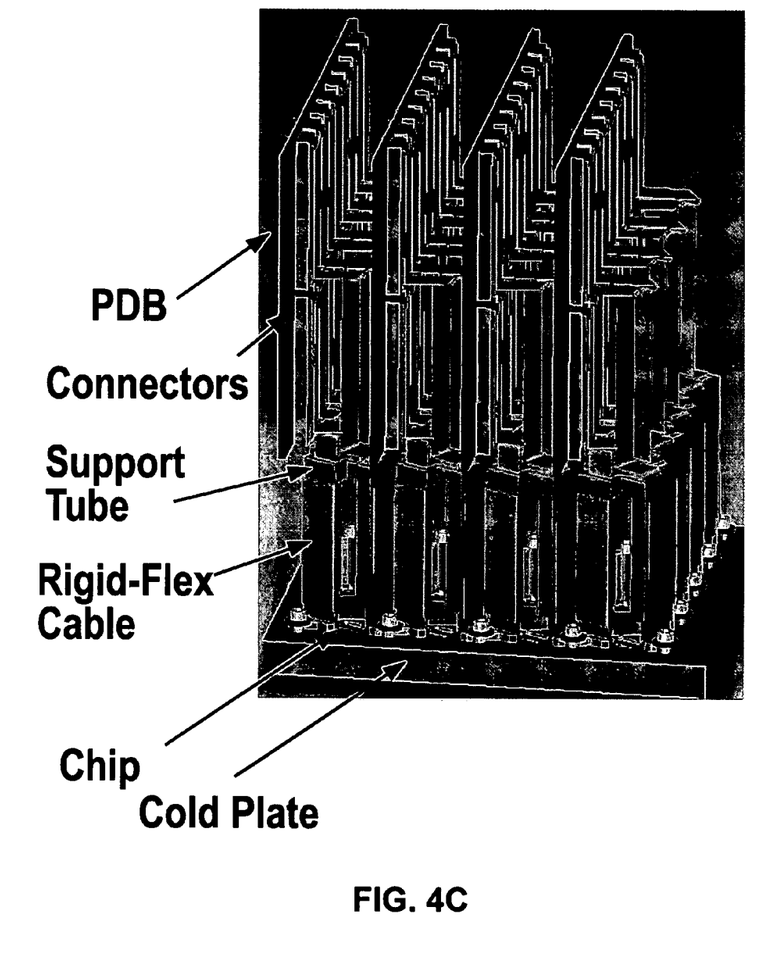
FIG. 4C presents an image of an alternate power distribution board configuration for a multi-chip module in accordance with an embodiment of the present invention.

FIG. 4B and FIG. 4C illustrate an alternate power distribution board configuration for a multi-chip module, in which the single PDB is replaced with a set of smaller, parallel PDBs. These PDBs are oriented vertically, perpendicular to the plane of the lower cooling plate 402, with one board on edge along each row of chips in the array. Sets of smaller PDBs provide a simpler design that can lower manufacture costs while maintaining easy plug-in and inspection of FCMs and open space for communications cables.

Benefits of the FCM Design

In summary, the advantages of the FCM design include (but are not limited to), by category:

Alignment: The alignment structure is only needed for x-y alignment, since the chips are supported in the vertical direction via contact with the rigid cooling plate. A virtue of the design is that the space between the PDB and the chip array is only loosely constrained, thereby allowing the use of a long rigid-flex cable with high compliance that facilitates alignment.

Alignment: The z-alignment between neighboring chips is dependent upon fewer variables than in previous designs. Specifically, in the present invention, the z-alignment depends on the thickness of the carrier chip and the thickness of the TIM.

Alignment: Z-compliant bridge chips can maintain zero separation with neighboring carrier chips, which significantly reduces the z-alignment risk as well as bridge-chip mounting requirements.

Thermal and Power Distribution: Decoupling the thermal and power distribution systems by delivering power from above via the rigid-flex cable results in lower heat and removes the need for thermal pedestals.

Power Distribution: Since the power distribution components are offset vertically from the plane of the alignment structure, the competition between communication and power distribution devices in the perimeter regions of previous MCM designs is no longer present; arbitrary chips in the array can communicate with external devices.

Mounting: The compressive force applied to the chips in proximity communication regions is independent of the forces on the FCM and the TIM interface.

Mounting: Since the chips are compliantly mounted to the rigid-flex cable, the power distribution system does not interfere with the intimate contact between the chips and the TIM. This leads to increased reliability of the TIM with respect to pump-out mechanisms.

Power Distribution: Integrating VRM chips on the rigid-flex cable allows current to be distributed in the PDB at a much higher voltage than in previous designs. Benefits of minimizing the distance which low-voltage currents must travel include a much-reduced power loss in the PDB as well as significant reductions in the amount of copper used in the system.

Mounting: Using a de-mateable connector between the rigid-flex cable and the PDB facilitates module assembly and rework.

Communication: The opportunity to create openings in the PDB to allow vertical access to the carrier chip array from assemblies above the PDB supports placing high-bandwidth optical chips and memory controllers anywhere in the array.

System scalability: The FCM design provides additional working space and a more open structure. Since FCMs are flexibly mounted into the MCM, a large array of FCMs can be pushed into intimate contact with the planar cooling plate. As a direct result of this organization, all signaling functionality is moved from the motherboard onto cheaper silicon, and the motherboard must no longer be re-designed when modules are swapped.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated circuit module, comprising:
   a semiconductor die with an active face upon which active circuitry and signal pads reside, and a back face opposite the active face;
   a bridge chip mounted to the semiconductor die in the integrated circuit module using a mounting, interconnect, and communication structure;
      wherein the bridge chip is positioned so that a free end is proximate to a neighboring semiconductor chip, and
      wherein the bridge chip supports proximity communication between the semiconductor die in the integrated circuit module and the neighboring semiconductor chip; and
   a flexible cable that delivers electrical power to the active face of the semiconductor die from a power distribution board located above the active face of the semiconductor die;
   wherein the flexible cable provides electrical power to the semiconductor die and does not interfere with alignment and heat removal functions for the module.

2. The integrated circuit module of claim 1, wherein the use of the flexible cable for power delivery facilitates the layout of arrays of multiple semiconductor dies in a single layer.

3. The integrated circuit module of claim 1,
   wherein the integrated circuit module further comprises a carrier chip;
   wherein the back face of the semiconductor die is attached to the carrier chip; and
   wherein the semiconductor die is electrically interconnected with the carrier chip.

4. The integrated circuit module of claim 3,
   wherein the carrier chip is mounted on top of a cooling plate;
   wherein the integrated circuit module further includes a thermal interface material between the carrier chip and the cooling plate;
   wherein the thermal interface material ensures a thermal connection between the carrier chip or semiconductor die and the cooling plate; and
   wherein heat is transferred from the semiconductor die and/or the carrier chip to the cooling plate.

5. The integrated circuit module of claim 4,
   wherein the integrated circuit module further comprises a spring assembly that applies force to the semiconductor die and/or the carrier chip to ensure intimate contact and thermal conductivity between the carrier chip and the cooling plate; and
   wherein lateral forces are applied to the semiconductor die and/or the carrier chip to ensure contact with a set of alignment structures.

6. The integrated circuit module of claim 1,
   wherein the flexible cable comprises both a flexible portion and a rigid portion;
   wherein the flexible portion of the flexible cable has sufficient flexibility that it will not impede the alignment process of the semiconductor die; and
   wherein the flexible cable comprises sufficient metal so that the electrical impedance will minimize voltage drop across the length of the flexible cable.

7. The integrated circuit module of claim 6, further comprising an integrated circuit which is integrated into the rigid portion of the flexible cable to enhance the functionality and performance of the semiconductor die; and
   wherein another rigid portion of the flexible cable is mounted to the semiconductor die.

8. The integrated circuit module of claim 7, wherein the integrated circuit which is integrated into the rigid portion of the flexible cable provides voltage conversion for the semiconductor die.

9. The integrated circuit module of claim 6,
   wherein the flexible cable connects to the power distribution board using a connector; and
   wherein the connector allows the integrated circuit module to be mechanically inserted or removed from an array of multiple modules;
   whereby mechanical insertion and removal eliminate a need to connect the flexible cable to the power distribution board using soldering operations.

10. The integrated circuit module of claim 1, wherein the power distribution board includes openings for optical fibers or electrical wires that facilitate communication between the semiconductor die and devices located about the power distribution board.

11. A computer system that includes an integrated circuit module, comprising:
    a semiconductor die;
    a flexible cable; and
    a bridge chip mounted to the semiconductor die in the computer system using a mounting, interconnect, and communication structure, and
       wherein the bridge chip is positioned so that a free end is proximate to a neighboring semiconductor chip;
       wherein the bridge chip supports proximity communication between the semiconductor die in the integrated circuit module and the neighboring semiconductor chip;
    wherein the semiconductor die includes an active face upon which active circuitry and signal pads reside, and a back face opposite the active face;
    wherein the flexible cable delivers electrical power to the active face of the semiconductor die from a power distribution board located above the active face of the semiconductor die; and
    wherein the flexible cable provides electrical power to the semiconductor die and does not interfere with alignment and heat removal functions for the module.

12. The computer system of claim 11, wherein the use of the flexible cable for power delivery facilitates the layout of arrays of multiple semiconductor dies in a single layer.

13. The computer system of claim 11,
wherein the computer system further comprises a carrier chip;
wherein the back face of the semiconductor die is attached to the carrier chip; and
wherein the semiconductor die is electrically interconnected with the carrier chip.

14. The computer system of claim 13,
wherein the carrier chip is mounted on top of a cooling plate;
wherein the computer system further includes a thermal interface material between the carrier chip and the cooling plate;
wherein the thermal interface material ensures a thermal connection between the carrier chip or semiconductor die and the cooling plate; and
wherein heat is transferred from the semiconductor die and/or the carrier chip to the cooling plate.

15. The computer system of claim 14, wherein the computer system further comprises a spring assembly that applies force to the semiconductor die and/or the carrier chip to ensure intimate contact and thermal conductivity between the carrier chip and the cooling plate; and
wherein lateral forces are applied to the semiconductor die and/or the carrier chip to ensure contact with a set of alignment structures.

16. The computer system of claim 11,
wherein the flexible cable comprises both a flexible portion and a rigid portion;
wherein the flexible portion of the flexible cable has sufficient flexibility that it will not impede the alignment process of the semiconductor die; and
wherein the flexible cable comprises sufficient metal so that the electrical impedance will minimize the voltage drop across the length of the flexible cable.

17. The computer system of claim 16, further comprising an integrated circuit which is integrated into the rigid portion of the flexible cable to enhance the functionality and performance of the semiconductor die; and
wherein another rigid portion of the flexible cable is mounted to the semiconductor die.

18. The computer system of claim 17, wherein the integrated circuit which is integrated into the rigid portion of the flexible cable provides voltage conversion for the semiconductor die.

19. The computer system of claim 16,
wherein the flexible cable connects to the power distribution board using a connector; and
wherein the connector allows the integrated circuit module to be mechanically inserted or removed from an array of multiple modules;
whereby mechanical insertion and removal eliminate a need to connect the flexible cable to the power distribution board using soldering operations.

20. A method for manufacturing an integrated circuit module, comprising:
arranging a flexible cable to deliver power to the active face of a semiconductor die from a power distribution board located above the active face of the semiconductor die, wherein the semiconductor die includes an active face upon which active circuitry and signal pads reside, and a back face opposite the active face;
mounting a bridge chip to the semiconductor die in the integrated circuit module using a mounting, interconnect, and communication structure;
positioning the bridge chip so that a free end is proximate to a neighboring semiconductor chip;
wherein the bridge chip supports proximity communication between the semiconductor die in the integrated circuit module and the neighboring semiconductor chip; and
wherein the flexible cable provides electrical power to the semiconductor die and does not interfere with alignment and heat removal functions for the module.

* * * * *